US010622961B2

(12) United States Patent
Arigong et al.

(10) Patent No.: US 10,622,961 B2
(45) Date of Patent: *Apr. 14, 2020

(54) REFLECTION TYPE PHASE SHIFTER WITH ACTIVE DEVICE TUNING

(71) Applicant: Infineon Technologies AG, Neubiberg (DE)

(72) Inventors: Bayaner Arigong, San Jose, CA (US); Richard Wilson, Morgan Hill, CA (US); Haedong Jang, San Jose, CA (US); Frank Trang, San Jose, CA (US); Timothy Canning, Morgan Hill, CA (US); Rongguo Zhou, Gilroy, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/225,615

(22) Filed: Dec. 19, 2018

(65) Prior Publication Data
US 2019/0149117 A1    May 16, 2019

Related U.S. Application Data

(62) Division of application No. 15/460,297, filed on Mar. 16, 2017, now Pat. No. 10,181,833.

(51) Int. Cl.
| H03H 7/20 | (2006.01) |
| H03H 11/20 | (2006.01) |
| H01L 29/78 | (2006.01) |
| H03H 7/18 | (2006.01) |
| H03H 7/19 | (2006.01) |

(52) U.S. Cl.
CPC ........... *H03H 7/20* (2013.01); *H01L 29/7816* (2013.01); *H03H 7/18* (2013.01); *H03H 7/19* (2013.01); *H03H 11/20* (2013.01)

(58) Field of Classification Search
CPC . H03H 7/20; H03H 11/22; H03H 7/16; H03H 7/19; H03H 11/18; H03H 11/20; H01L 29/7816; H01P 1/18; H01P 5/16; H03C 7/025
See application file for complete search history.

(56) References Cited

U.S. PATENT DOCUMENTS

| 8,022,787 B2 | 9/2011 | Inoue et al. |
| 2018/0019722 A1 | 1/2018 | Birkbeck |

OTHER PUBLICATIONS

Burdin, F, et al., "Design of Compact Reflection-Type Phase Shifters with High Figure-of-Merit", IEEE Transactions on Microwave Theory and Techniques, vol. 63, No. 6, Jun. 2015, pp. 1883-1893.

(Continued)

*Primary Examiner* — Jung Kim
(74) *Attorney, Agent, or Firm* — Murphy, Bilak & Homiller, PLLC

(57) ABSTRACT

A phase shifter having a four port hybrid coupler is provided. The four port hybrid coupler has first and second input ports and first and second output ports. The four port hybrid coupler is configured to shift the phase of an RF signal as between the first and second input ports. First and second active semiconductor devices are connected to first and second output ports. The first and second active semiconductor devices are configured to change the phase shift of the RF signal as between the first and second input ports based upon a varying voltage.

6 Claims, 5 Drawing Sheets

(56) References Cited

OTHER PUBLICATIONS

Lin, C, et al., "Design of a Reflection-Type Phase Shifter with Wide Relative Phase Shift and Constant Insertion Loss", IEEE Transactions on Microwave Theory and Techniques, vol. 55, No. 9, Sep. 2007, pp. 1862-1868.

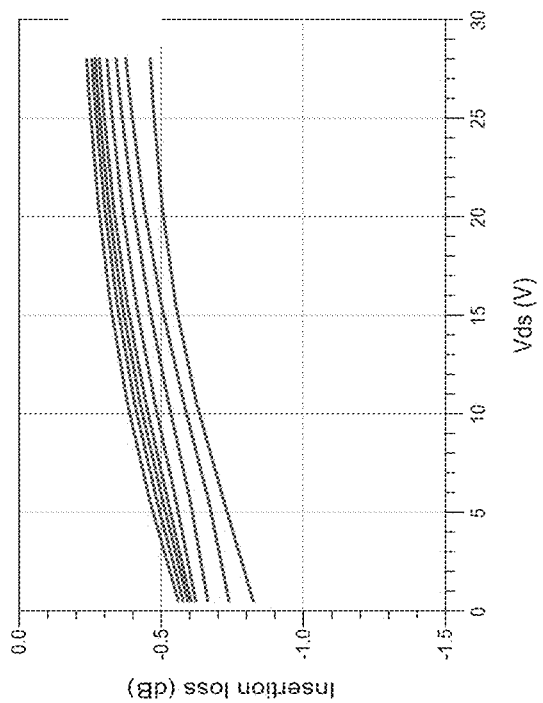
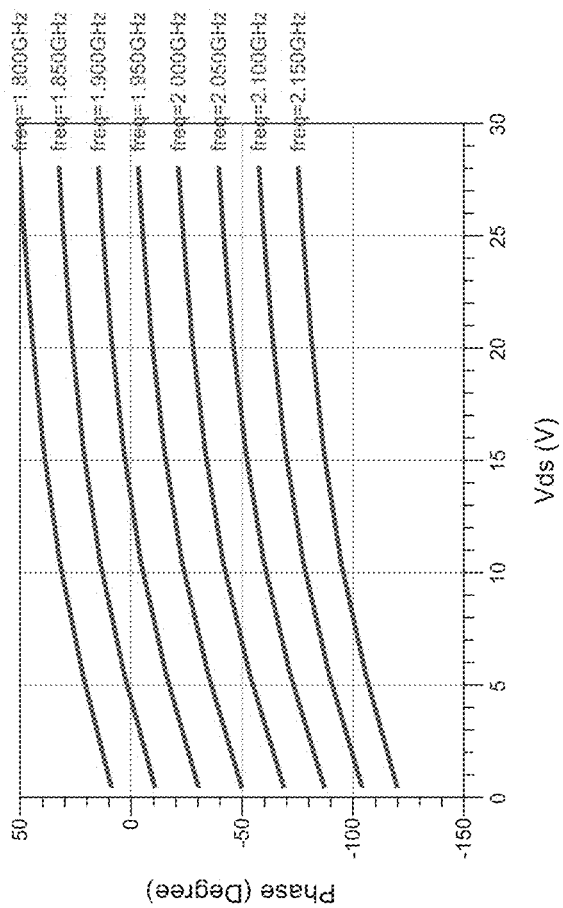
FIG. 5B
FIG. 5A
FIGURE 5

US 10,622,961 B2

REFLECTION TYPE PHASE SHIFTER WITH ACTIVE DEVICE TUNING

RELATED APPLICATIONS

This is a divisional application of U.S. application Ser. No. 15/460,297 filed on Mar. 16, 2017, the contents of which are incorporated by reference in their entirety.

TECHNICAL FIELD

The present application relates to RF communication systems, and in particular relates to phase shifters.

BACKGROUND

Phase shifters have a wide variety of uses in current and next generation communication systems. Phase shifters are used to adjust the transmission phase of RF signals in beam-forming, in-phase modulation, and power amplifier circuits, for example. Fifth generation (5G) wireless systems represent one emerging application for phase shifters. Fifth generation (5G) wireless systems use a plurality of antennas and phase shifting to simultaneously transmit and receive multiple RF signals and thereby achieve faster download speeds, greater bandwidth, spectral efficiency, lower latency, etc.

Generally speaking, phase shifters fall into two broad categories: active phase shifters and passive phase shifters. Passive phase shifters include only passive elements (e.g., inductors, transmission lines, etc.) whereas active phase shifters use at least one active element (e.g., transistors, thyristors, etc.). Active phase shifters consume additional power in comparison to passive phase shifters. Therefore, passive phase shifters are preferable in base station and mobile device applications.

Passive phase shifters are classified into four broad categories: switched line phase shifters, transmission type phase shifters, L-C lumped element phase shifters, and reflection type phase shifters. Switched line phase shifters switch between transmission lines of different length to achieve a desired delay. Switched line phase shifters can have the drawback of high insertion loss as more stages are cascaded to increase resolution. A transmission type phase shifter is realized by loading a reactive impedance on a transmission line, and tuning the impedance value to change the phase of the RF signal. The drawback of the transmission type phase shifter is that the input impedance is difficult to match when the phase is tuning, which turns results in a high return loss. L-C lumped element phase shifters use a plurality of lumped elements (e.g., capacitors and inductors). In order to tune the phase, a variable capacitor can be substituted in place of some or all of the capacitors. One disadvantage of this type of phase shifter is that the characteristic impedance of phase shifter changes and is therefore difficult to match. A reflection type phase shifter can include a 3 dB coupler with reactive terminated load. One benefit of a reflection type phase shifter is very low return loss and matched port impedance. However, the size and bandwidth of reflection type phase shifters, which is determined by the properties of the 3 dB coupler, limits their applicability.

SUMMARY

A phase shifter is disclosed. According to an embodiment, the phase shifter includes first and second RF terminals, a reference potential terminal, a lumped element LC network connected to the first and second RF terminals and the reference potential terminal, and first and second active semiconductor devices connected to the lumped element LC network and to the reference potential terminal. Each of the first and second active semiconductor devices include a control terminal and first and second output terminals. The lumped element LC network presents a reactance across the first and second RF terminals that shifts the phase of an RF signal as between the first and second RF terminals. The first and second active semiconductor devices are configured to tune the phase shift of the RF signal by controlling the reactance across the first and second RF terminals.

According to another embodiment, the phase shifter includes a four port hybrid coupler including first and second input ports and first and second output ports. The four port hybrid coupler is configured to shift the phase of an RF signal as between the first and second input ports. The phase shifter further includes first and second active semiconductor devices connected to first and second output ports. The first and second active semiconductor devices are configured to change the phase shift of the RF signal as between the first and second input ports based upon a varying voltage.

A method of shifting the phase of an RF signal. According to an embodiment, the method includes providing a phase shifter having first and second RF terminals, a reference potential terminal, a hybrid coupler, and first and second active semiconductor devices. The first and second RF terminals are connected to first and second input ports of the hybrid coupler. The first and second active semiconductor devices are connected to first and second output ports of the hybrid coupler. An RF signal is applied at the first RF terminal and is phase shifted at the second RF terminal. A phase shift of the RF signal as between the first and second RF terminals is adjusted by varying a reflected impedance between the first and second RF terminals using the first and second active semiconductor devices.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A and 3B, illustrates impedance tuning ranges for the phase shifter across varying drain-source voltage ranges, according to an embodiment. FIG. 3A illustrates the capacitance variation of the active semiconductor device across the tuning range and FIG. 3B illustrates the resistance variation of the active semiconductor device across the tuning range.

FIG. 5, which includes FIGS. 5A and 5B, illustrates phase tuning performance of the phase shifter across a wideband frequency range, according to an embodiment. FIG. 5A depicts the phase tuning range of the phase shifter and FIG. 5B depicts the insertion loss of the phase shifter.

DETAILED DESCRIPTION

Embodiments of a wideband compact phase shifter with low insertion loss are described herein. The phase shifter is configured as a reflection type phase shifter, but has a compact design and greater bandwidth than previous reflection type phase shifter designs. The phase shifter includes a hybrid coupler and phase tuning devices. According to an embodiment, the hybrid coupler is provided from a lumped element network of high-Q inductors and capacitors. The phase tuning devices, which are connected to the output ports of the hybrid coupler, are configured to tune the reflected phase shift of the RF signal at the input ports by varying the impedance at the output ports of the hybrid coupler. According to one embodiment, the phase tuning devices are provided by two laterally diffused metal oxide semiconductor (LDMOS) transistors. Advantageously, these devices can be configured as controllable capacitor/resistors, wherein the impedance is controlled by varying the drain-source voltage of the devices. The drain-source capacitance of these devices is independent of frequency. Therefore, the 3 dB coupler can be tuned across a wideband frequency range (e.g., between 1.8 GHz and 2.2 GHz). According to one embodiment, inductance and capacitance values of the lumped element network are optimized accounting for the parasitic capacitance and inductance of the LDMOS transistors to provide low variance in insertion loss across a wideband frequency range.

Figure 1:
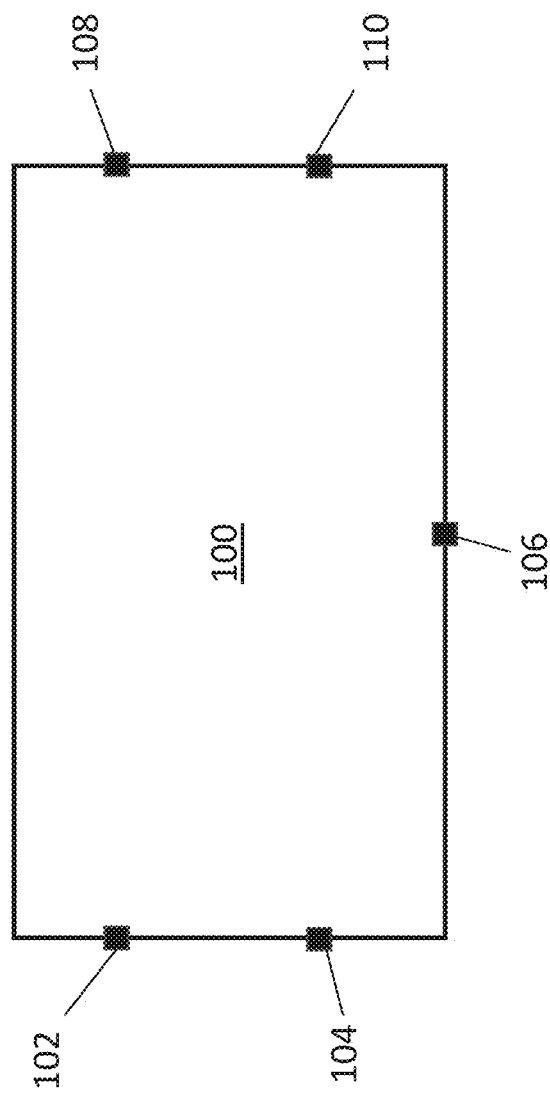
FIG. 1 illustrates a high level schematic of a phase shifter, according to an embodiment.

Referring to FIG. 1, a schematic of a phase shifter 100 is depicted, according to an embodiment. The phase shifter 100 includes first and second RF terminals 102, 104, a reference potential terminal 106, a first voltage terminal 108, and a second voltage terminal 110. Each of these terminals are independent from one another. The phase shifter 100 is configured to receive an RF signal at the first RF terminal 102, and to provide a phase shifted version of the RF signal at the second RF terminal 104. The reference potential terminal 106 is configured to receive a fixed reference potential (e.g., GND). The first voltage terminal 108 and the second voltage terminal each receive independent voltages that are used to tune the phase shift of the RF signal.

Figure 2:
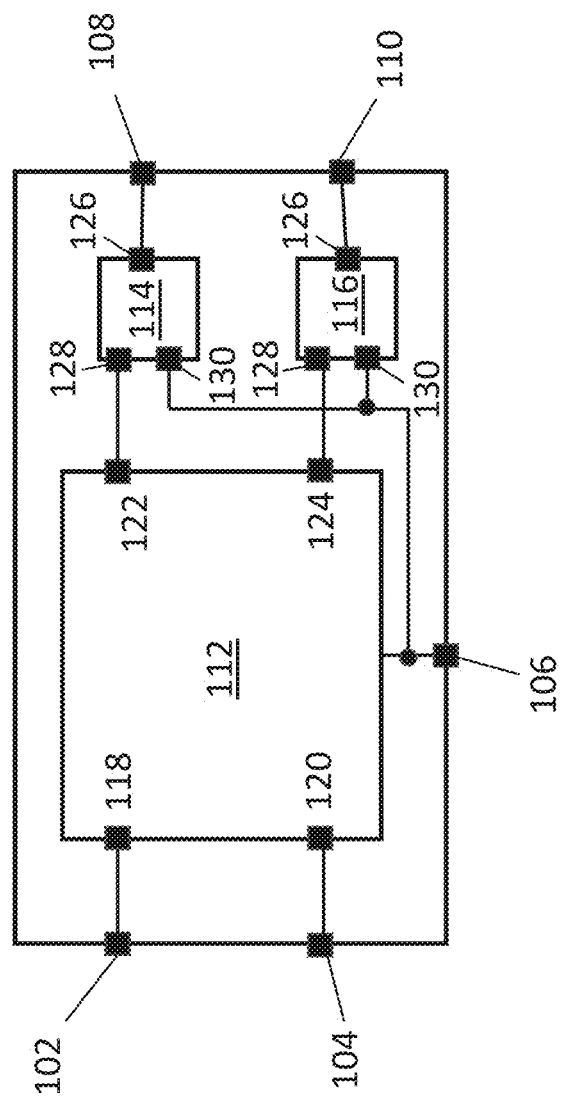
FIG. 2 illustrates a lower level schematic of the phase shifter, according to an embodiment.

Referring to FIG. 2, a lower level schematic of the phase shifter 100 is depicted, according to an embodiment. The phase shifter 100 includes a four port hybrid coupler 112 and first and second active semiconductor devices 114, 116. The four port hybrid coupler 112 includes first and second input ports 118, 120 and first and second output ports 122, 124. The first and second input ports 118, 120 are connected to the first and second RF terminals 102, 104 of the phase shifter 100. Each of the first and second active semiconductor devices 114, 116 include a control terminal 126 (e.g., a gate terminal), a first output terminal 128 (e.g., a drain terminal), and a second output terminal 130 (e.g., a source terminal). The control terminals 126 of the first and second active semiconductor devices 114, 116 are each electrically connected to the first voltage terminal 108. The second output terminals 130 of the first and second active semiconductor devices 114, 116 are each electrically connected to the reference potential terminal 106. The first output terminals 128 of the first and second active semiconductor devices 114, 116 are electrically connected to first and second output ports 122, 124, respectively, of the phase shifter 100.

The phase shifter 100 is configured as a so-called reflection type phase shifter 100. In such a device, the phase shifter 100 uses the reflective properties of the hybrid coupler 112 to shift the phase of an RF signal as between the first and second input ports 118. That is, an RF signal applied to the first input port 118 will be reflected by the hybrid coupler 112 and appear as a phase shifted version of the RF signal at the second input port 120, and vice-versa.

Generally speaking, the hybrid coupler 112 can have any of a variety of different configurations, e.g., lumped element, transmission line, Lange, etc. The basic working principle of the hybrid coupler 112 is as follows. As is well known in the art, a four port hybrid (3 dB) coupler divides the power of an RF signal as between two ports. For example, if an RF signal is applied to the first input port 118, a first ½ power (−3 dB) version of the RF signal appears at the first output port 122, and second ½ power (−3 dB) version of the RF signal appears at the second output port 124. Moreover, the first power (−3 dB) version of the RF signal is phase shifted from the original RF signal by a first value (e.g., 90 degrees) and the second ½ power (−3 dB) version of the original RF signal is phase shifted by a second value (e.g., 180 degrees). By loading the first and second output ports 122, 124 with a reactive impedance (e.g., a capacitor), the RF signals at the first and second output ports 122, 124 are reflected back across the hybrid coupler 112. Nominally, the reflections completely cancel out at the first input port 118 and completely combine at the second input port 120. As a result, a phase shifted version of the RF signal appears at the second input port 120. The degree of phase shift depends upon the reactive impedance presented to the first and second output ports 122, 124.

Tuning of the phase shift for the phase shifter 100 is provided by the first and second active semiconductor devices 114, 116. In this circuit, the first and second active semiconductor devices 114, 116 are connected and operated in such a way that the impedance presented to the first and second output ports 122, 124 of the hybrid coupler 112 can be changed. More particularly, the first active semiconductor device is configured to present a varying capacitance and resistance to the first output port 122. The second active semiconductor device is configured to present a varying capacitance and resistance to the second output port 124.

In general, the first and second active semiconductor devices 114, 116 can be any semiconductor device with defined, controllable output impedance. Examples of these switching devices include power transistors, such as a MOSFETs (metal-oxide semiconductor field-effect transistor), DMOS (double-diffused metal-oxide semiconductor) devices, GaN HEMTs (gallium nitride high electron mobility transistor), GaN MESFETs (gallium nitride metal-semiconductor field-effect transistor), LDMOS (laterally diffused metal oxide semiconductor) transistors, etc.

Figure 3:
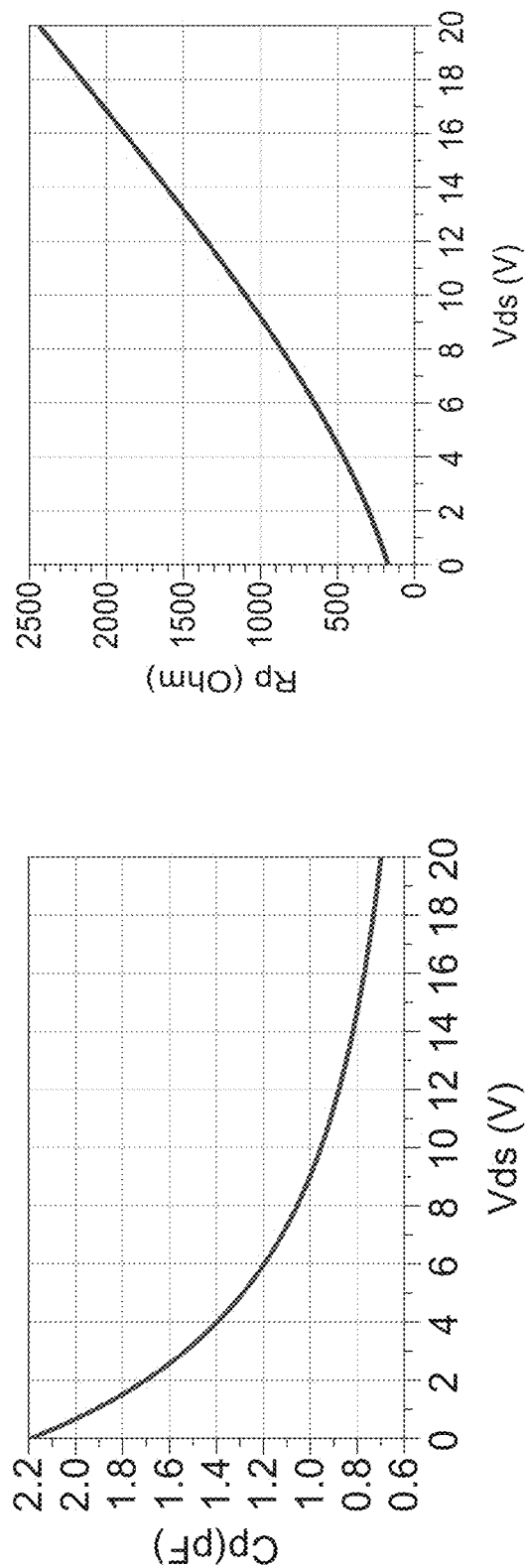
FIG. 3, which includes

Referring to FIG. 3, exemplary impedance tuning ranges for an LDMOS device are shown. In these figures, the LDMOS device is turned OFF (i.e., maintained at zero gate bias), the drain-source voltage of the LDMOS device is varied, and the impedance response is measured. As can be seen, in the OFF state, the LDMOS devices behave as a capacitive resistor, wherein the capacitance and resistance depends upon the drain-source voltage applied to the device. As can be seen in FIG. 3A, across a voltage range of 0V-20V being applied to the drain and source terminals of the LDMOS device, the capacitance across the drain and source terminals of the LDMOS device varies from about 2.2 pF (picoFarads) to about 0.5 pF. As can be seen in FIG. 3B, across a voltage range of 0V-20V being applied to the drain and source terminals of the LDMOS device, the resistance across the drain and source terminals of the LDMOS device varies from about 200 Ohms to about 2400 Ohms.

Accordingly, the above described drain-source voltage/impedance dependency in LDMOS devices can be used to vary the impedance presented to the first and second output ports 122, 124. Consequently, the degree of phase shift between the first and second first and second RF terminals 102, 104 can be varied by varying the drain-source voltage of the LDMOS devices.

Figure 4:
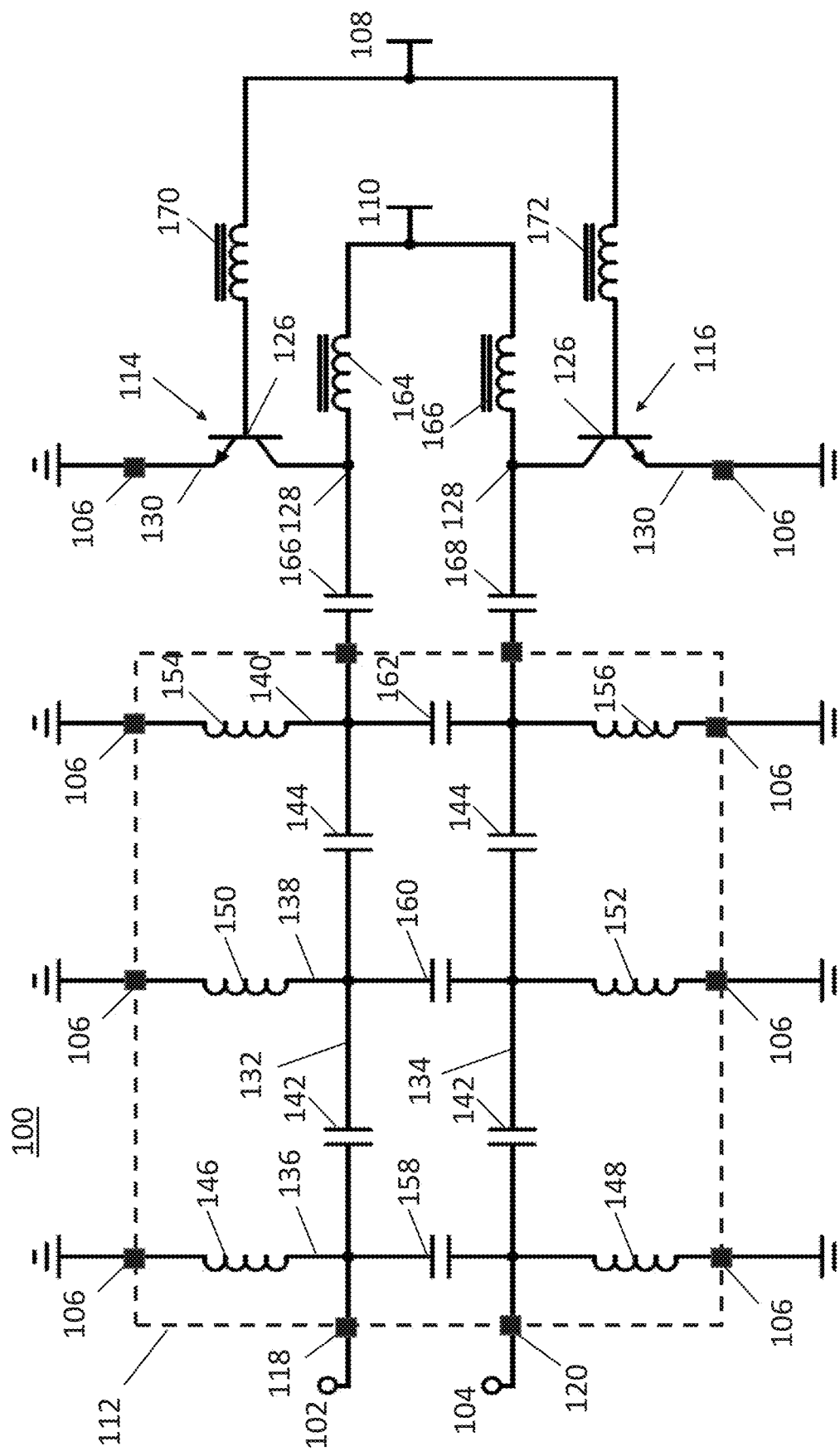
FIG. 4 illustrates a circuit topology of a phase shifter, according to an embodiment.

Referring to FIG. 4, an exemplary circuit topology for the phase shifter 100 is depicted, according to an embodiment. In this embodiment, the hybrid coupler 112 is configured as a lumped element LC network and the first and second active semiconductor devices 114, 116 are configured as MOSFET devices.

In the depicted embodiment, the lumped element LC network includes first and second series branches 132, 134. The first series branch 132 is connected in series between the first RF terminal 102 and a first output terminal 128 of the first active semiconductor device 114, and the second series branch is connected in series between the second RF terminal 104 and the first output terminal 128 of the second active semiconductor device 116. "Connected in series" refers to the fact that electrical current flowing between the series connected terminals (e.g., the first RF terminal 102 and a first output terminal 128) must pass through every element of the series connected branch.

In the depicted embodiment, the lumped element LC network additionally includes first, second and third parallel branches 136, 138, 140. The first, second and third parallel branches 136, 138, 140 are each connected in parallel with the reference potential terminal 106. "Connected in parallel" refers to the fact that current flowing between parallel connected terminals can pass through the elements from any one of multiple parallel connected branches.

The first series branch 132 includes a capacitive element connected in series between the first RF terminal 102 and the first output terminal 128 of the first active semiconductor device 114. The second series branch 134 includes a capacitive element connected in series between the second RF terminal 104 and the first output terminal 128 of the second active semiconductor device 116. In the depicted embodiment, the first and second series branches 132, 134 each include a first capacitor 142 directly connected between the first parallel branch 136 and the second parallel branch 138. In addition, the first and second series branches 132, 134 each include a second capacitor 144 directly connected between the second parallel branch 138 and the third parallel branch 140.

The first, second and third parallel branches 136, 138, 140 each include inductive elements that are connected to the reference potential terminal 106. More particularly, the first parallel branch 136 includes a first inductor 146 directly connected between the first series branch 132 and the reference potential terminal 106, and a second inductor 146 directly connected between the second series branch 134 and the reference potential terminal 106. The second parallel branch 138 includes a third inductor 150 directly connected between the first series branch 132 and the reference potential terminal 106, and a fourth inductor 152 directly connected between the second series branch 134 and the reference potential terminal 106. The third parallel branch includes a fifth inductor 154 directly connected between the first series branch 132 and the reference potential terminal 106, and a sixth inductor 156 directly connected between the second series branch 134 and the reference potential terminal 106.

The first, second and third parallel branches 136, 138, 140 each include capacitive elements. More particularly, the first parallel branch 136 includes a third capacitor 158 directly connected between the first and second series branches 132, 134. The second parallel branch 138 includes a fourth capacitor 160 directly connected between the first and second series branches 132, 134. The third parallel branch 140 includes a fifth capacitor 162 directly connected between the first and second series branches 132, 134.

According to an embodiment, first and second RF chokes 164, 166 are connected between the first output terminals 128 of the first and second active semiconductor devices 114, 116, respectively, and the second voltage terminal 110. In addition, according to an embodiment, first and second DC blocking capacitors 166, 168 are connected between the first output terminals 128 of the first and second active semiconductor devices 114, 116 and the first and second series branches 132, 134. As those having ordinary skill will appreciate, RF chokes block high frequency signals (i.e., A/C signals) while permitting lower frequency signals (i.e., DC signals) to pass. Moreover, series connected capacitors do the opposite, i.e., permit high frequency signals (i.e., A/C signals) to pass while blocking DC signals. In this way, a frequency independent DC voltage can be applied to the first output terminals 128 of the first and second active semiconductor devices 114, 116, respectively, and this DC voltage can be isolated from the lumped element LC network.

According to an embodiment, third and fourth RF chokes 170, 172 are connected between the control terminals 126 of the first and second active semiconductor devices 114, 116, respectively, and the first voltage terminal 108. In this way, the third and fourth RF chokes 170, 172 present a high impedance to an RF signal and a low impedance to the DC control voltage.

Described below is a method for determining the parameter values of the inductors and capacitors of the lumped element LC network so as to provide a wideband frequency response with low insertion loss variance.

The reflection coefficient $\Gamma_L$ of the hybrid coupler 112 is given by:

$$\Gamma_L = \frac{Z_L - Z_T}{Z_L + Z_T} = \frac{R_P - Z_T - jZ_T R_P W C_P}{R_P + Z_T - jZ_T R_P W C_P}. \quad (1)$$

wherein $Z_T$ is the impedance looking into the hybrid coupler 112 from the first and second input ports 118, 120, $Z_L$ is the impedance looking outside of the hybrid coupler 112 from the first and second input ports 118, 120, $C_p$ is the capacitance of the first and second active semiconductor devices 114, 116, $R_p$ is the resistance of the first and second active semiconductor devices 114, 116, and $W=2\pi f_0$, wherein $f_0$ is the center frequency of the RF signal.

Assuming that the impedance at the first and second input ports 118, 120 is $Z_0$, and $Z_0=\gamma Z_T$, wherein $\gamma$ is impedance transformation ratio of coupler, the scattering parameter $S_{21}$ of the phase shifter 100 is given by:

$$S_{21} = j\alpha^2 |\Gamma_L| e^{j\Phi_{21}} \quad (2)$$

wherein $\alpha$ represents the loss of the hybrid coupler 112 that results from the Q factor of the lumped elements inductors and capacitors.

The phase $\angle S_{21}$ of the phase shifter 100 is given by:

$$\angle S_{21} = \frac{\pi}{2} + \Phi_{21} = \frac{\pi}{2} + \tan^{-1}\left(\frac{-Z_T R_p W C_p}{R_p - Z_T}\right) - \tan^{-1}\left(\frac{Z_T R_p W C_p}{R_p + Z_T}\right) \quad (3)$$

The phase tuning range $\Delta\Phi$ of the phase shifter 100 is given by:

$$\Delta\Phi = \left|\tan^{-1}\left(\frac{Z_0 R_p W C_{max}}{(\gamma R_p - Z_0)}\right) + \tan^{-1}\left(\frac{Z_0 R_p W C_{max}}{(\gamma R_p + Z_0)}\right)\right| - \left|\tan^{-1}\left(\frac{Z_0 R_p W C_{min}}{(\gamma R_p - Z_0)}\right) + \tan^{-1}\left(\frac{Z_0 R_p W C_{min}}{(\gamma R_p + Z_0)}\right)\right| \quad (4)$$

The insertion loss IL of the phase shifter 100 is given by:

$$IL = \alpha^2 |\Gamma_L|^2 = \alpha^2 \frac{(R_p - Z_T)^2 + (Z_T R_p W)^2}{(R_p + Z_T)^2 + (Z_T R_p W)^2} \quad (5)$$

A phase tuning range of 50° is desirable in applications such as Doherty power amplifier splitter circuits in wireless base station applications. Nominally, the insertion loss of the phase shifter 100 should vary by as little as possible across a wideband frequency range of the phase shifted RF signal. Based on the two requirements for the phase shifter 100, it is found that $\gamma$ is the only parameter that can be optimized in the equation (4) and (5).

Once the $\gamma$ is determined, the parameter values of the lumped element network can be determined as follows.

The capacitance $CM_1$ of the first capacitor 142 is given by:

$$CM_1 = \frac{2}{W\sqrt{n_1} Z_0 \left(\sqrt{2+\sqrt{2}}\right)}, \quad (6)$$

The capacitance $CM_2$ of the second capacitor 144 is given by:

$$CM_2 = \frac{1}{\sqrt{n}} CM_1, \quad (7)$$

The capacitance $C_1$ of the third capacitor 158 is given by:

$$C_1 = \frac{1}{Z_0 W}(\sqrt{2} - 1), \quad (8)$$

The $C_2$ capacitance of the fourth capacitor 160 is given by:

$$C_2 = \frac{2}{n_1} C_1, \quad (9)$$

The capacitance $C_3$ of the fifth capacitor 162 is given by:

$$C_3 = \frac{1}{n} C_1, \quad (10)$$

The inductance $L_1$, of the first and second inductor 146s is given by:

$$L_1 = \frac{1}{W^2 (CM_1 + C_1)}, \quad (11)$$

The inductance $L_2$ of the third and fourth inductor 152s is given by:

$$L_2 = \frac{1}{W^2 (CM_1 + CM_2 + C_2)}, \quad (12)$$

The inductance $L_3$ of the fifth and sixth inductor 156s is given by:

$$L_3 = \frac{1}{W^2 (CM_2 + C_3)}, \quad (13)$$

wherein in the above equations (6)-(13)

$$n = \frac{Z_T}{Z_0} \text{ and } n_1 = \left(\frac{Z_0}{Z}\right)^{-1}.$$

Referring to FIG. 5, the phase tuning performance of the phase shifter 100 is with parameter values of the inductors and capacitors of the lumped element LC network being determined, according to the above described method. FIG. 5A depicts the phase tuning range $\Delta\Phi$ of the phase shifter 100 over a varying output voltage $V_{DS}$ range of 0-28 V. Various frequency plots from a center frequency $f_0$ of 1.8 GHz to a center frequency $f_0$ of 2.15 GHz. As can be seen, for each frequency point, a consistent phase shift of about 40 degrees is obtained. Thus, the phase shifter 100 has a phase tuning range $\Delta\Phi$ across a wideband frequency range of 1.8 GHz to 2.15 GHz.

Referring to FIG. 5B, the insertion loss IL of the phase shifter 100 is depicted over a varying output voltage Vds range of 0-28 V. Various frequency plots from a center frequency $f_0$ of 1.8 GHz to a center frequency $f_0$ of 2.15 GHz. As can be seen, for each frequency point, the insertion loss is consistent and non-varying over the tuning range.

As used herein, a "lumped element LC network" refers to an electrical circuit topology that includes inductors and capacitors. These inductors and discrete capacitors have a known inductance and capacitance, respectively, that substantially predominate over parasitic effects to define the impedance response of the network. The lumped element LC network can be implemented with each of these inductors and capacitors being discrete components, e.g., using a printed circuit board and conductive connections between the discrete components. Alternatively, some or all of the inductors and capacitors can be part of an integrated circuit.

Terms such as "same," "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

The term "directly electrically connected" or "in direct electrical contact" describes a permanent low-ohmic connection between electrically connected elements, for example a wire connection between the concerned elements.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase shifter, comprising:

a four port hybrid coupler comprising first and second input ports and first and second output ports, the four port hybrid coupler being configured to shift the phase of an RF signal as between the first and second input ports;

a reference potential terminal;

a second independent voltage terminal;

first and second active semiconductor devices, each of the first and second active semiconductor devices comprising a control terminal and first and second output terminals, wherein the first and second active semiconductor devices are configured to change the phase shift of the RF signal as between the first and second input ports based upon a varying voltage, wherein the first output terminals of the first and second active semiconductor devices are respectively electrically coupled to the first and second output ports of the four port hybrid coupler, wherein the second output terminals of the first and second active semiconductor devices are each electrically connected to the reference potential terminal, wherein the first output terminals of the first and second active semiconductor devices are each electrically coupled to the second independent voltage terminal, and wherein the impedance of the first and second active semiconductor devices is independently controllable via an external voltage applied to the second independent voltage terminal.

2. The phase shifter of claim 1, wherein the first active semiconductor device is configured to present a varying capacitance and resistance to the first output port in response to the varying voltage, and wherein the second active semiconductor device is configured to present a varying capacitance and resistance to the second output port in response to the varying voltage.

3. The phase shifter of claim 1, wherein the first and second active semiconductor devices are configured to tune the phase shift of the RF signal by at least forty degrees.

4. The phase shifter of claim 3, wherein the phase shifter has an insertion loss variation less than −0.3 dB across a tuning range and bandwidth of the phase shifter.

5. The phase shifter of claim 1, wherein the phase shifter is configured to electrically isolate a DC signal applied to the second independent voltage terminal from the four port hybrid coupler and to apply the electrically isolated DC signal to the first output terminals of the first and second active semiconductor devices.

6. The phase shifter of claim 5, wherein the phase shifter further comprises:

first and second DC blocking capacitors electrically connected between the first output terminals of the first and second active semiconductor devices and the first and second output ports, respectively; and third and fourth RF chokes electrically connected between the second independent voltage terminal and the first output terminals of the first and second active semiconductor devices.

\* \* \* \* \*